United States Patent
Yao et al.

(10) Patent No.: US 7,713,576 B2
(45) Date of Patent: May 11, 2010

(54) METHOD TO PRODUCE A RELIABLE PIEZOELECTRIC THICK FILM ON A SUBSTRATE

(75) Inventors: Kui Yao, Singapore (SG); Xu Jiang He, Singapore (SG); Yuan Xu, Singapore (SG); Eng Hock Francis Tay, Singapore (SG)

(73) Assignee: Agency for Science, Technology and Research, Singapore Science Park II (SG)

( * ) Notice: Subject to any disclaimer, the term of this patent is extended or adjusted under 35 U.S.C. 154(b) by 1107 days.

(21) Appl. No.: 10/680,229

(22) Filed: Oct. 8, 2003

(65) Prior Publication Data

US 2004/0071864 A1 Apr. 15, 2004

(30) Foreign Application Priority Data

Oct. 9, 2002 (SG) .............................. 200206099-4

(51) Int. Cl.
*B05D 5/12* (2006.01)
*H01L 41/22* (2006.01)

(52) U.S. Cl. ..................................... 427/100; 29/25.35
(58) Field of Classification Search ................. 427/100; 29/25.35
See application file for complete search history.

(56) References Cited

U.S. PATENT DOCUMENTS

| | | | |
|---|---|---|---|
| 4,283,228 A * | 8/1981 | Buchanan et al. | 501/134 |
| 5,318,725 A * | 6/1994 | Sandhage | 428/701 |
| 5,433,917 A * | 7/1995 | Srivastava et al. | 419/22 |
| 6,355,185 B1 | 3/2002 | Kubota | |
| 2002/0171182 A1 | 11/2002 | Kim et al. | |
| 2003/0134156 A1 | 7/2003 | Kim et al. | |

FOREIGN PATENT DOCUMENTS

| | | |
|---|---|---|
| GB | 2161647 A | 1/1986 |
| JP | 03-283583 | 12/1991 |
| JP | 2000-315827 | 11/2000 |
| SG | 9703488-8 | 11/1997 |

OTHER PUBLICATIONS

Morten et al., Resonant pressure sensor based on piezoelectric properties of ferroelectric thick films, Sensors and Actuators A, vol. 31, pp. 153-158, (1992).

(Continued)

*Primary Examiner*—Brian K Talbot
(74) *Attorney, Agent, or Firm*—Birch, Stewart, Kolasch & Birch, LLP

(57) ABSTRACT

A method of producing a piezoelectric ceramic thick film on a substrate, said method comprising:
providing a piezoelectric ceramic material in powder form; forming a liquid mixture by mixing the powdered material with a liquid phase precursor of a metal oxide of low-melting point, said precursor being adapted to decompose, upon subsequent annealing, into the metal oxide; drying the liquid mixture to form a precipitate; milling the precipitate to form a powdered precipitate; adding an organic carrier to the powdered precipitate; further milling the precipitate to form a paste; depositing a layer of the paste, as a wet film, onto the substrate; and annealing the layered substrate at a temperature and for a time sufficient to cause transformation of the paste into the thick film.

24 Claims, 1 Drawing Sheet

OTHER PUBLICATIONS

Prudenziati et al., "Piezoelectric Thick-film Materials and Sensors", Microelectronics International, No. 38, pp. 5-11, (Sep. 1995).

Fernandez et al., Processing and microstructure of porous and dense PZT thick films on $Al_2O_3$, Journal of Materials Science, vol. 30, pp. 5399-5404, (1995).

Chen et al., "Dielectric, ferroelectric, and piezoelectric properties of lead zirconate titanate thick films on silicone substrate," Journal Applied Physics, vol. 77, No. 7, pp. 3349-3353, (Apr. 1, 1995).

Cicco et al., "Elastic Surface Wave Devices Based on Piezoelectric Thick-Films", IEEE Transactions on Ultrasonics, Ferroelectrics, and Frequency Control, vol. 43, No. 1, pp. 73-77, (Jan. 1, 1996).

Maas et al., "Thick-film printing of PZT onto silicon", Materials Letter, vol. 31, pp. 109-112, (1997).

Ferrari et al., "Thick-film resonant piezo-layers as new gravimetric sensors", Meas. Science Technology, vol. 8, pp. 42-48, (1997).

Yao et al., "Improved preparation procedure and properties for multiplayer piezoelectric thick-film actuator", Sensors and Actuators, vol. A71, pp. 139-143, (1998).

Akiyama et al., "Development of Lead Zirconate Titanate Family Thick Films on Various Substrates", Jpn. J. Appl. Phys., vol. 38, pp. 5524-5527, (1999).

Beeby et al., "Thick film PZT/micromachined silicon accelerometer", Electronics Letters, vol. 35, No. 23, pp. 2060-2062, (Nov. 11, 1999).

Ferrari et al., "Multisensor array of mass microbalances for chemical detection based on resonant piezo-layers of screen-printed PZT", Sensors and Actuators, vol. B68, pp. 81-87, (2000).

Glynne-Jones et al., "An investigation into the effect of modified firing profiles on the piezoelectric properties of thick-film PZT layers on silicon", Meas. Science Technology, vol. 11, pp. 526-531, (2000).

Beeby et al., "Silicon micromechanical resonator with thick-film printed vibration excitation and detection mechanisms", Sensors and Actuators, vol. A88, pp. 189-197, (2001).

Thiele et al., "Processing and Properties of Screen-Printed Lead Zirconate Titanate Piezoelectric Thick Films on Electroded Silicon", J. Am. Ceram. Soc., vol. 84, No. 12, pp. 2863-2868, (2001).

* cited by examiner

METHOD TO PRODUCE A RELIABLE PIEZOELECTRIC THICK FILM ON A SUBSTRATE

This nonprovisional application claims priority under 35 U.S.C. §119(a) on Patent Application No. 200206099-4 filed in SINGAPORE on Oct. 9, 2002, which is herein incorporated by reference.

TECHNICAL FIELD

This invention relates to piezoelectric devices and, more particularly, methods of producing such devices. In particular, the invention relates to a method of fabricating a piezoelectric device involving printing a paste containing piezoelectric ceramic material onto a substrate so as to form a piezoelectric ceramic thick film on the substrate.

BACKGROUND OF THE INVENTION

A number of materials are known to exhibit a piezoelectric effect, being the generation of electricity under mechanical stress. Conversely, such materials may undergo a degree of physical deformation when subjected to an electrical field. These piezoelectric manifestations are utilised in a number of "piezoelectric" devices which generate either an electrical signal caused by pressure (used as sensors) or deformation by exposure to an electrical field (used as actuators). This piezoelectric effect is the result of the anisotropy of the crystalline structure (eg. Quartz, ferroelectric lead zirconate titanate (PZT) ceramics).

Ferroelectric ceramics, such as PZT, are now used in diverse technological applications where the unique piezoelectric (and ferroelectric) properties of these materials can be exploited. Piezoelectric devices have been made by forming PZT thin films on a substrate where the film thickness typically ranges from about 0.1 to 1.0 μm. These devices have use in microelectronic and micro-systems applications.

Piezoelectric devices have also been made of bulk piezoelectric ceramics. The bulk piezoelectric ceramics are formed by the sintering of discrete ceramic particles without a substrate.

There has, over recent years, been an increasing interest in piezoelectric ceramic thick film technology in relation to applications that combine device performance requirements approaching those of bulk piezoelectrics but with the miniature size scale required for use in microelectronic packages. The term "thick film" in the present context means a film having a thickness of between about 10 μm and 100 μm.

Thick layers of piezoelectric ceramic material are advantageous in that larger actuating forces, or (in the case of the reverse effect) larger sensing signals, may be generated (when compared to thin-film devices).

It is perceived that piezoelectric ceramic (eg PZT) thick films will have applications in various devices including chemical sensors, torque and pressure sensors, pyroelectric arrays, buzzers, micro-pumps, high frequency ultrasonic transducers, mass microbalances, microactuators, microtransducers, micro-accelerometers, micro-strain gauges and micro-resonators.

Various technologies are relatively well known for the formation of thin film piezoelectric ceramics and bulk ceramics. However, the integration of piezoelectric ceramic thick films into micro-electronic packages poses a number of technical difficulties relating primarily to processing and integration compatibility with the underlying substrate.

In recent years, it has been discovered that the deposition of piezoelectric ceramic powders (in paste form), by printing the paste onto the substrate, followed by annealing (ie firing), is an efficient method to form a piezoelectric thick film of about 10 μm to 100 μm on a substrate. This annealing step is done so as to sinter the particles together to form a cohesive film with suitable electrical and mechanical properties.

However, the processing temperature for sintering piezoelectric ceramic, such as PZT, is as high as 1,200° C. (for several hours). Temperatures of this magnitude are not compatible with many of the substrates, including electroded silicon. This is because at such elevated temperatures, lead diffuses into the bottom electrode and silicon substrate, and thus the substrate is damaged. Accordingly, in the formulation of piezoelectric ceramic thick films on silicon substrates, the maximum allowable firing (annealing) temperature is between about 900° C. and about 1,000° C.

Certain sintering aids for PZT and other piezoelectric ceramic thick films have been developed. Sintering aids for PZT which have been developed are generally low-melting metal oxide powders. The addition of these metal oxide powders relies, at least in part, on liquid-phase sintering for densification of the ceramic. The presence of such metal oxide powder enables sintering to occur at lower temperatures. The chosen metal oxide powder is typically added to the PZT powder through mechanical mixing and this is followed by the further addition of an organic carrier (or vehicle). The powders and the organic carrier are well mixed to form a paste. This paste is then, typically, screen-printed onto the substrate as a wet film. This wet film is then dried and the layered substrate then undergoes annealing at temperatures of between about 800° C. and 1,000° C. The above sintering aids (eg metal oxide powders) help to keep the annealing temperature at a level which inhibits (or reduces) diffusion of lead into the silicon substrate, and reduces the damage of the bottom electrode and the substrate.

However, the mechanical mixing method of the piezoelectric ceramic powder with the metal oxide powder, which is added as the sintering aid, results in a significant lack of homogeneity in the distribution of the metal oxide powder throughout the PZT powder in the as-deposited film. In turn, this lack of homogeneity results in a non-uniform distribution of the liquid-phase of the added sintering aids in the sintering process. This adversely affects the stability of the resultant thick film and the piezoelectric properties of the film. In comparison with bulk ceramic, this problem is particularly serious for the thick film in which a high sintering temperature and long sintering time are not allowed in order to minimise the damage of the bottom electrode and the substrate.

Accordingly, the present invention is directed towards a method of producing a piezoelectric thick film on a substrate with improved uniform distribution of the glass-bonding phase in the piezoelectric ceramic materials and, therefore, having more reliable piezoelectric performance.

Throughout this specification, unless the context requires otherwise, the word "comprise" or variations such as "comprises" or "comprising", will be understood to imply the inclusion of a stated element, integer or step, or group of elements, integers or steps, but not the exclusion of any other element, integer or step, or group of elements, integers or steps.

Any discussion of documents, acts, materials, devices, articles or the like, which has been included in the present specification, is solely for the purpose of providing a context for the present invention. It is not to be taken as an admission that any or all of these matters form part of the prior art base or were common general knowledge in the field relevant to the present invention as it existed before the priority date of each claim of this application.

SUMMARY OF THE INVENTION

According to a first aspect of this invention, there is provided a method of producing a piezoelectric ceramic thick film on a substrate, said method comprising:

- providing a piezoelectric ceramic material in powder form;
- forming a liquid mixture by mixing the powdered material with a liquid phase precursor of a metal oxide of low-melting point, said precursor being adapted to decompose, upon subsequent annealing, into the metal oxide;
- drying the liquid mixture to form a precipitate;
- milling the precipitate to form a powdered precipitate;
- adding an organic carrier to the powdered precipitate;
- further milling the precipitate to form a paste;
- depositing a layer of the paste, as a wet film, onto the substrate; and
- annealing the layered substrate at a temperature and for a time sufficient to cause transformation of the paste into the thick film.

The piezoelectric ceramic material may be any inorganic ceramic material which exhibits the piezoelectric effect, such as the ferroelectric ceramics. A preferred ferroelectric ceramic is lead zirconate titinate (PZT). Other ferroelectric ceramics which may be used include $PbTiO_3$, $BaTiO_3$, $PbZrO_3$, $Pb(Mg,Nb)O_3$, $Pb(Zr,Nb)O_3$, $Pb(Ni,Nb)O_3$, $KNbO_3$, $KTaO_3$, $NaNbO_3$, $LiNbO_3$.

The metal oxide may be any metal oxide which promotes the sintering process of the piezoelectric ceramic at a lower temperature. Preferably, the metal oxide is one which is adapted to form a glass phase upon annealing at elevated temperature. Suitable metal oxides include one or more of $Li_2O$, $Bi_2O_3$ and PbO.

Preferably, the liquid phase precursor is a combination of the liquid phase precursors of $Li_2O$ and $Bi_2O_3$. The liquid phase precursor of $Li_2O$ is preferably lithium ethoxide dissolved in ethanol. The liquid phase precursor of $Bi_2O_3$ is preferably bismuth nitrate dissolved in acetic acid. These liquid phase precursors are mixed to form a Li—Bi acetic acid solution (which is transparent).

The powdered piezoelectric ceramic material (such as PZT) may be added to this Li—Bi acetic acid solution. However, it is preferred that the powdered material is in the form of a suspension. This suspension may consist of the powder suspended in ethanol. The powdered material is thereby mixed with the liquid agent by combining the powder suspension with the Li—Bi acetic acid solution to form the liquid mixture. The liquid mixture, obtained by mixing the powder suspension with the Li—Bi acetic acid solution, has a greater degree of homogeneity than would otherwise be obtained by simply mixing the powdered material with the Li—Bi acetic acid solution.

Alternatively, the metal oxide may be PbO in which case the liquid phase precursor would be a solution of lead acetate. In this case, the above step would involve this lead acetate solution instead of the Li—Bi acetic acid solution.

It is preferable that the powdered ceramic material in the suspension is fine-grained having, for instance, an average grain size below about 1.0 µm. It is particularly preferred that the average grain size is about 0.5 µm.

The quantity of the liquid phase precursor of the metal oxide will be quite small as only a small amount of glass phase is desired. If too much glass phase is produced, the piezoelectric performance of the resultant thick film will be significantly weakened. It has been found that the preferred doping amount of the metal oxide (eg $Li_2O$ and $Bi_2O_3$) is between about 1 to about 5 weight percent of the abovementioned paste.

The abovementioned liquid mixture should be dried at an elevated temperature so as to form a dried precipitate. Preferably, the drying procedure is carried out between about 75-150° C. for about 1 to 10 hours. The dried precipitate is then formed into a powder, preferably by milling with a ball mill. The organic carrier is then added and the ball milling process is continued so as to form a paste. This results in the metal oxide dopant being homogeneously distributed throughout the powdered piezoelectric ceramic material. By using the liquid phase precursors of the metal oxide (eg. $Li_2O$, $Bi_2O_3$, or PbO), these precursors form a coating around the grains of powder resulting in a highly homogenous distribution of the dopant material.

The main purpose of the organic carrier is so as to give the dried precipitate a pasty nature. This carrier can be any suitable organic solvent. Suitable solvents have been found to include ethyl cellulose, terpineol, ESL400 organic vehicle and ethanol. A particularly preferred carrier is ESL400.

The abovementioned paste is then deposited onto a surface of the substrate as a wet film. This deposition is typically achieved by any suitable printing process, such as a screen printing process.

The wet film may then be dried at room temperature or at an elevated temperature for a shorter time, for instance at a temperature of about 150° C.

The printing and drying process may be repeated to achieve an increased thickness.

The layered substrate is then generally annealed at a temperature of between about 800° C. to about 1000° C. Temperatures in the range of about 820° C. to about 950° C. are particularly preferred. The layered substrate will be subjected to such annealing for a period of time of between about 10 min to a few hours.

Prior to this annealing step, an isostatic pressure may be applied to the film. This tends to improve the green density (ie the density before final annealing or sintering) of the film and to enhance, during the annealing step, the bonding effect of the dopant metal oxide.

The relevant substrate may be silicon (eg a Si wafer). The silicon substrate may also have a coating of platinum onto which the abovementioned paste is deposited. This platinum coating may be applied by sputtering.

In order to enhance the piezoelectric properties of the thick film, the film will typically undergo a polarisation step. This helps to achieve good piezoelectric properties of the thick film.

In order for the piezoelectric effect to be utilised, the above-mentioned device needs to incorporate means by which an electric field may either be applied or detected. Therefore, electrodes are typically placed across the thick film. Accordingly, the above method may include additional steps such as the formation of a metal electrode material on the thick film. This metal electrode may be formed of silver and the electrode may be deposited on the thick film by printing (eg screen printing) processes. The layered substrate may then be fired so as to form the electrode.

In order that the present invention may be more clearly understood, preferred forms of the invention will be described with reference to the following drawings and examples.

DETAILED DESCRIPTION OF THE INVENTION

Figure 1:
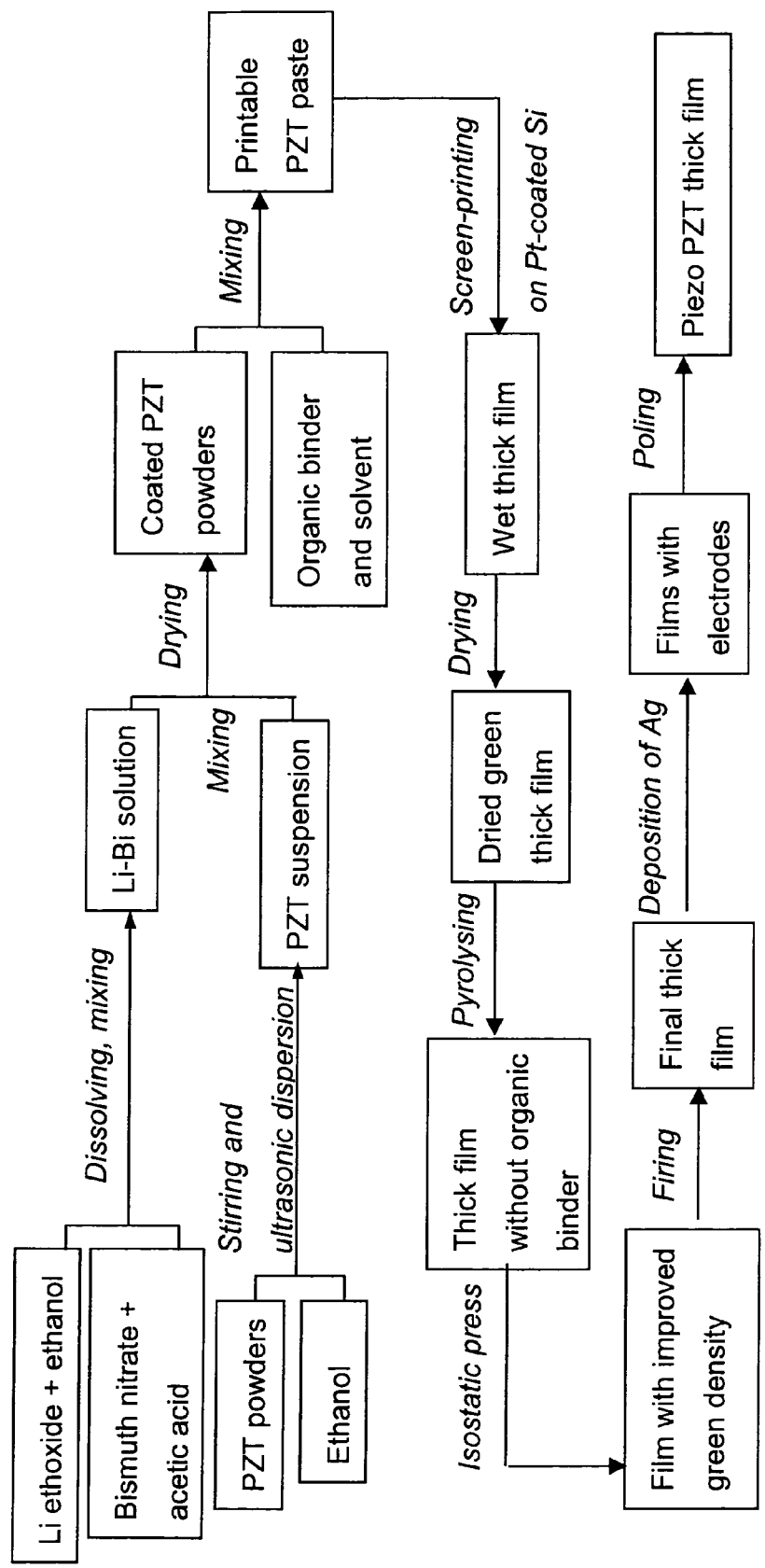
FIG. 1 schematically illustrates the processing flow for preparing the PZT piezoelectric thick film according to example 1(below).

A preferred embodiment of the method of this invention is described below by reference to the following examples. These examples are illustrations only of a preferred embodiment of the invention. The invention is not, however, limited to the features specified in these examples.

Example 1

In example 1, bismuth oxide and lithium oxide were selected as the sintering aids.

An ethanol solution of 0.003972 mol lithium ethoxide was mixed with 0.24 g of glacial acetic acid by stirring. 0.003972 mol of bismuth nitrate pentahydrate was dissolved in 14 g of glacial acetic acid at a temperature of 75° C. After cooling down to room temperature, the bismuth nitrate solution was mixed with the lithium ethoxide solution at a temperature of 65° C. The mixed solution was the transparent precursor solution containing the Bi and Li elements.

97.5 g of lead zirconate titanate (PZT) powders with an average grain size of 0.5 μm was dispersed in 70 g of ethanol by stirring with an ultrasonic vibration. After the Bi—Li precursor solution was mixed with the PZT suspension, the mixture was dried at 78° C. overnight to obtain a precipitate of the PZT powders with the added Bi and Li elements. The precipitate was milled in an agate ball for 3 hours at a speed of 300 rpm, and then 32 g of ESL400 binder was added and the ball-milling process was continued for another 3 hours to form the PZT paste with a suitable viscosity and rheology for the following printing process.

A 4-inch single crystal silicon wafer was selected as the substrate on which the PZT paste was to be deposited. The 4-inch Si wafer was (100) oriented, and was coated by a sputtering process with a Pt layer of 0.5 to 1 μm in thickness and an intermediate Ti layer having a thickness of 0.05 μm. With a screen printer, the PZT paste was forced by a squeegee through the open pattern in a stencil screen and deposited onto the Pt-coated Si wafer. The wet film was dried at 150° C. for 3 minutes, and the printing and drying process was repeated twice to increase the thickness of the films.

The dried film was first fired in air at a temperature of 400° C. for 10 hours to remove the organic binders.

The Si substrate with the PZT film was loaded into a flexible soft plastic bag with good tenacity. The soft plastic bag was evacuated using a vacuum pump and then the bag was hermetically packaged. The package was completely immersed in a liquid medium in an isostatic pressure machine, and an isostatic pressure of 3500 kg/cm$^2$ was applied and held for 10 minutes.

The pressed film was fired at a temperature of 925° C. in air for 30 minutes.

A commercial silver paste from Dupont was deposited by screen printing process on the top of the fired PZT film, and fired at 520° C. in air for 10 minutes to form the top electrode for the PZT film.

An electrical field of 150 kV/cm was applied to the PZT thick film for poling.

Example 2

In example 2, lead oxide was selected as the sintering aid.

0.02298 mol lead acetate trihydrate was dissolved in 40 g of acetic acid at an elevated temperature of 105° C.

97.5 g of PZT powders with an average grain size of 0.5 μm was dispersed in 70 g of ethanol by stirring with an ultrasonic vibration. After the lead acetate precursor solution was mixed with the PZT suspension, the suspension was dried at 78° C. for 1 hour, and then 110° C. for 2 hours, and finally at 78° C. overnight to form a precipitate of the PZT powders with the added Pb element. The dried precipitate was milled in an agate ball for 3 hours at a speed of 300 rpm, and then 34 g of ESL400 binder was added. The ball-milling process was continued for another 3 hours to get the PZT paste with a suitable viscosity and rheology for the printing process.

The subsequent printing process and poling process were the same as for Example I.

The piezoelectric ceramic thick films formed according to the methods of the abovementioned invention have porous features and exhibit reliable piezoelectric responses. The stable piezoelectric vibration module of the film under AC electrical stimulation was observed with a laser scanning vibrometer. They possess a very high piezoelectric voltage constant ($g^{33}$) of 32 mmV/N. This is largely due to the porous nature of the films and their small dielectric constant. The piezoelectric voltage constant for such films is generally higher than that of typical bulk piezoelectric ceramics. This makes these thick films very attractive as integrated piezoelectric sensors for a variety of applications.

Accordingly, the abovementioned invention provides an efficient way of forming piezoelectric ceramic thick films having reliable performance characteristics at relatively low temperatures. It also enables piezoelectric ceramic thick films to be formed on substrates, such as silicon and glass, for which excessively high temperatures (eg in excess of 1000° C.) is not technically feasible.

It will be appreciated by persons skilled in the art that numerous variations and/or modifications may be made to the invention as described herein without departing from the spirit or scope of the invention. The present embodiments are therefore to be considered in all respects as illustrative and not restrictive.

The claims defining this invention are as follows:

1. A method of producing a piezoelectric ceramic thick film on a substrate, said method comprising:

mixing liquid phase precursors of $Li_2O$ and $Bi_2O_3$ metal oxides to form a Li—Bi solution;

forming a suspension of a piezoelectric ceramic material in powder form and a fluid medium by ultrasonic vibration;

forming a liquid mixture by mixing the suspension of powdered material with the Li—Bi solution, the $Li_2O$ and $Bi_2O_3$ having melting points lower than a temperature required for densifying the piezoelectric ceramic thick film by sintering, said liquid mixture obtained by mixing the suspension of powdered material and the Li—Bi solution having a greater degree of homogeneity than that of a mixture obtained by mechanically mixing the powdered material;

drying the liquid mixture to form a dried precipitate;

milling the dried precipitate to form a powdered precipitate;

adding an organic carrier to the powdered precipitate;

further milling the powdered precipitate to form a paste;

depositing a layer of the paste, as a wet film, onto the substrate; and annealing the substrate with the film at a temperature and for a time sufficient to cause transformation of the paste into the thick film.

2. A method according to claim 1, wherein the piezoelectric ceramic material is an inorganic ceramic material which exhibits the piezoelectric effect.

3. A method according to claim 2, wherein the piezoelectric ceramic material is lead zirconate titanate (PZT).

4. A method according to claim 1, wherein the $Li_2O$ and $Bi_2O_3$ metal oxides are adapted to form a glass phase upon annealing at a temperature between 800° and 1000° C.

5. A method according to claim 1, wherein the powdered piezoelectric material is fine-grained having an average grain size of below about 1.0 μm.

6. A method according to claim 5, wherein the average grain size is about 0.5 μm.

7. A method according to claim 1, wherein the total amount of the $Li_2O$ and $Bi_2O_3$ metal oxides in the thick film are between about 1% and 5%, by weight.

8. A method according to claim 1, wherein the liquid mixture is dried at a temperature between 75° and 150° C. to form the dried precipitate.

9. A method according to claim 8, wherein the liquid mixture is dried at a temperature between about 75° C. and 105° C. for up to 10 hours.

10. A method according to claim 1, wherein the powdered precipitate is formed by milling the dried precipitate with a ball mill.

11. A method according to claim 1, wherein the organic carrier is selected from one or more of ethyl cellulose, terpineol, and an organic binder containing texanol.

12. A method according to claim 11, wherein the organic carrier is the organic binder containing texanol.

13. A method according to claim 1, wherein the paste is deposited onto a surface of the substrate, by a printing process, as the wet film.

14. A method according to claim 13, wherein the printing process is a screen printing process.

15. A method according to claim 1, wherein, prior to annealing, the layered substrate including the deposited wet film is dried.

16. A method according to claim 1, wherein, prior to annealing, an isostatic pressure is applied to the film.

17. A method according to claim 15, wherein the drying temperature of the layered substrate including the deposited wet film is between about 20° C. and about 175° C.

18. A method according to claim 1 wherein the layered substrate is annealed at a temperature of between about 820° C. and about 950° C.

19. A method according to claim 18, wherein the annealing is conducted for between about 10 minutes and about 4 hours.

20. A method according to claim 1, wherein the substrate is formed of silicon.

21. A method according to claim 1, wherein the surface of the substrate has a coating of platinum and the paste is deposited on this platinum coating.

22. A method according to claim 1, wherein a metal electrode is formed on the piezoelectric ceramic thick film.

23. A method according to claim 22, wherein the metal electrode is formed of silver and the electrode is deposited on the film by a screen printing process.

24. A method according to claim 1, wherein the powdered precipitate is formed by milling the dried precipitate with a ball mill,
   wherein the layered substrate is annealed at a temperature of between about 820° C. and about 950° C. for about 4 hours,
   wherein a metal electrode is formed on the piezoelectric ceramic thick film.

* * * * *